United States Patent
Kimura et al.

(12) 
(10) Patent No.: US 6,558,567 B2
(45) Date of Patent: May 6, 2003

(54) PIEZOELECTRIC CERAMIC COMPACT AND PIEZOELECTRIC CERAMIC DEVICE USING THE SAME

(75) Inventors: Masahiko Kimura, Nagaokakyo (JP); Takuya Sawada, Nagaokakyo (JP); Akira Ando, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 41 days.

(21) Appl. No.: 09/860,983

(22) Filed: May 18, 2001

(65) Prior Publication Data

US 2002/0005683 A1 Jan. 17, 2002

(30) Foreign Application Priority Data

May 18, 2000 (JP) ........................................ 2000-146653

(51) Int. Cl.$^7$ ..................... C04B 35/462; C04B 35/453; H01L 41/187
(52) U.S. Cl. .......................... 252/62.9 PZ; 252/62.9 R; 501/134; 501/135; 501/136; 501/137; 501/138; 501/139
(58) Field of Search ...................... 252/62.9 R, 62.9 PZ; 501/134, 135, 136, 137, 138, 139

(56) References Cited

U.S. PATENT DOCUMENTS

| 4,900,702 A | * | 2/1990 | Tsuboi et al. | 501/134 |
| 6,004,474 A | * | 12/1999 | Takenaka et al. | 252/62.9 R |
| 6,080,327 A | * | 6/2000 | Takenaka et al. | 252/62.9 R |
| 6,241,908 B1 | * | 6/2001 | Hirose et al. | 252/62.9 R |
| 6,398,978 B1 | * | 6/2002 | Hirose et al. | 252/62.9 R |

OTHER PUBLICATIONS

Hirose et al., "Piezoelectric properties of SrBi4Ti4O15–Based Ceramics", Jpn. J. Appl. Phys., vol. 38 (1999), pp. 5561–5563, Part I, No. 9, Sep. 1999.*

"Preparation of Bi–Based Ferroelectric Thin Films by Sol-Gel Method"; Tsutomu Atsuki, et al.; *Jpn. J. Appl. Phys.*; vol. 34 (1995); pp. 5096–5099.

* cited by examiner

*Primary Examiner*—Elizabeth D. Wood
(74) *Attorney, Agent, or Firm*—Dickstein, Shapiro, Morin & Oshinksy, LLP.

(57) ABSTRACT

Provided is a piezoelectric ceramic compact useful as a material for a piezoelectric ceramic compact device or the like, having $SrBi_4Ti_4O_{15}$ as a main component, containing no or a small amount of lead or lead compound, and exhibiting a $Q_{max}$ improved to a level permitting practical use application. The piezoelectric ceramic compact includes a bismuth layer compound as a main component composed of Sr, Bi, Ti and oxygen, and when the molar ratio of Sr, Bi and Ti of the bismuth layer compound as the main component is a:b:c, the relations of $0.13 \leq a/c < 0.25$ and $3.5 \leq (2a+3b)/c \leq 3.75$ are satisfied.

20 Claims, 1 Drawing Sheet

PIEZOELECTRIC CERAMIC COMPACT AND PIEZOELECTRIC CERAMIC DEVICE USING THE SAME

BACKGROUND OF THE INVENTION

1. Field of the Invention

The present invention relates to piezoelectric ceramics and a piezoelectric ceramic device using the same, and particularly to piezoelectric ceramics useful as materials for piezoelectric ceramic devices such as a piezoelectric ceramic filter, piezoelectric ceramic oscillator, piezoelectric ceramic vibrator, etc, and a piezoelectric ceramic device using the ceramics.

2. Description of the Related Art

Piezoelectric ceramics comprising lead titanate zirconate ($Pb(Ti_xZr_{1-x})O_3$) or lead titanate ($PbTiO_3$) as a main component are conventionally widely used as piezoelectric ceramics for piezoelectric ceramic devices such as a piezoelectric ceramic filter, piezoelectric ceramic oscillator, piezoelectric ceramic vibrator, etc. However, the piezoelectric ceramics comprising lead titanate zirconate as a main component has a composition containing a large amount of lead, and thus has the problem of deteriorating the uniformity of a product due to evaporation of lead oxides during the production process. In order to solve this problem, it is preferable to use a piezoelectric ceramic compact having a composition containing no lead or only a small amount of lead.

A piezoelectric ceramic compact comprising a bismuth layer compound such as $SrBi_4Ti_4O_{15}$ as a main component has a composition containing no lead oxide, it does not cause the above problem.

However, a material used for a piezoelectric ceramic device, particularly a piezoelectric ceramic oscillator, generally preferably has a high maximum ($Q_{max}$) of the electrical quality factor Q (1/tan δ) in a band, i.e., at a frequency between the resonance frequency and anti-resonance frequency. A piezoelectric ceramic compact comprising the bismuth layer compound such as $SrBi_4Ti_4O_{15}$ as the main component has the problem of failing to obtain a sufficient $Q_{max}$ which enables practical use applications.

SUMMARY OF THE INVENTION

Accordingly, it is a main object of the present invention to provide a piezoelectric ceramic compact useful as a material for a piezoelectric ceramic device, comprising $SrBi_4Ti_4O_{15}$ as a main component, containing no or a small amount of lead or lead compound, and exhibiting $Q_{max}$ improved to a level permitting practical use, and a piezoelectric ceramic device using the piezoelectric ceramic compact.

In order to achieve the object of the present invention, there is provided a piezoelectric ceramic compact comprising a bismuth layer compound as a main component composed of Sr, Bi, Ti and oxygen, wherein when the molar ratio of Sr, Bi and Ti of the bismuth layer compound as the main component is a:b:c, the relations of $0.13 \leq a/c < 0.25$ and $3.5 \leq (2a+3b)/c \leq 3.75$ are satisfied.

The piezoelectric ceramic compact of the present invention may contain a bivalent metal element other than Sr or a trivalent metal element other than Bi at a ratio of about 0.05 mol or less (but not O) to 1 mol of Ti in the main component. The bivalent metal element other than Sr contained in the main component is at least one selected from, for example, Mg, Ca, Ba and Pb. The trivalent metal element other than Bi contained in the main component is at least one selected from, for example, Sc, Y, La, Ce, Pr, Nd, Sm, Gd, Dy, Er and Yb.

The piezoelectric ceramic compact of the present invention may further contain less than about 0.025 mol (but not O) of Zr relative to 1 mol of Ti in the main component.

The piezoelectric ceramic compact of the present invention may further contain Mn at a ratio of about 1.5% by weight or less (but not O) in terms of $MnCO_3$.

A piezoelectric ceramic device of the present invention comprises a piezoelectric ceramic compact of the present invention, and an electrode formed on the piezoelectric ceramic compact.

Although the piezoelectric ceramic compact of the present invention comprises a sintered body obtained by burning a raw material composition for piezoelectric ceramics, the composition ratio is substantially constant before and after burning.

The piezoelectric ceramic compact of the present invention comprises a bismuth layer compound as a main component composed of Sr, Bi, Ti and oxygen, wherein when the molar ratio of Sr, Bi and Ti of the bismuth layer compound as the main component is a:b:c, the ratio is limited to a range so as to satisfy the relations of $0.13 \leq a/c < 0.25$ and $3.5 \leq (2a+3b)/c \leq 3.75$. This is because out of this range, a degree of $Q_{max}$ permitting practical use applications cannot be obtained.

The piezoelectric ceramic compact of the present invention contains a bivalent metal element other than Sr or a trivalent metal element other than Bi at a ratio of about 0.05 mol or less (but not O) to 1 mol of Ti in the main component, thereby making the effect of the present invention significant. The ratio of the bivalent metal element other than Sr or the trivalent metal element other than Bi is about 0.05 mol or less (but not O) relative to 1 mol of Ti in the main component. This is because of the tendency that the addition of over about 0.05 mol of such a metal element deteriorates $Q_{max}$ as compared with a case in which such a metal element is not added.

The piezoelectric ceramic compact of the present invention further contains less than about 0.025 mol (not O) of Zr relative to 1 mol of Ti in the main component, thereby making the effect of the present invention further significant. The ratio of Zr contained is set to less than about 0.25 mol to 1 mol of Ti in the main component because of the tendency that the addition of about 0.25 mol or more of Zr deteriorates $Q_{max}$ as compared with the case in which Zr is not added.

The piezoelectric ceramic compact of the present invention may further contain Mn at a ratio of about 1.5% by weight or less (not O) in terms of $MnCO_3$, thereby making the effect of the present invention further significant. The ratio of Mn contained is set to about 1.5% by weight or less in terms of $MnCO_3$ because of the tendency that the addition of 1.5% by weight or more of Mn deteriorates $Q_{max}$ as compared with a case in which Mn is not added.

The object, other objects, characteristics and advantages of the present invention will be made further clear by detailed description of embodiments of the present invention below.

DESCRIPTION OF THE PREFERRED EMBODIMENT

Embodiment

Figure 1:
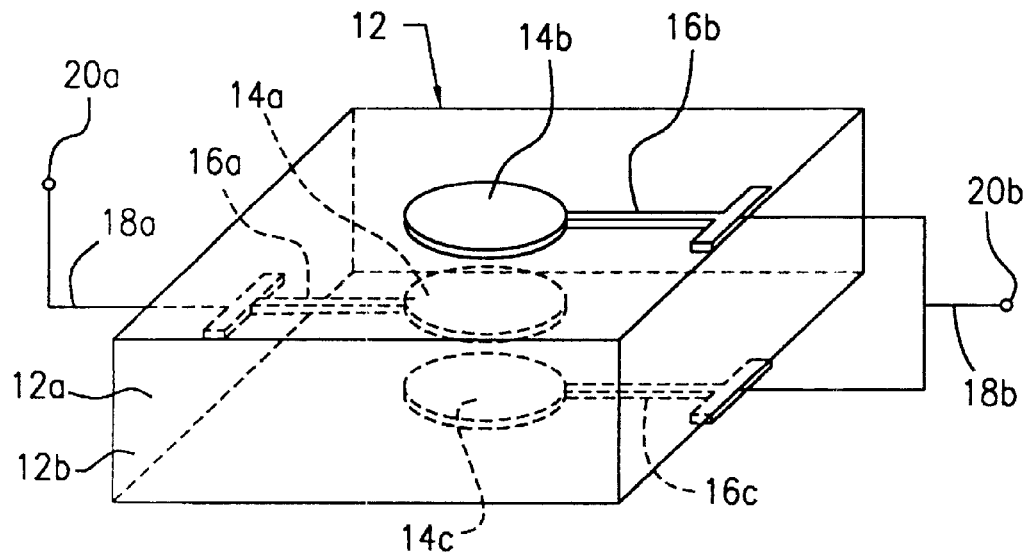
FIG. 1 is a perspective view showing an example of a piezoelectric ceramic vibrator according to the present invention.

First, $SrCO_3$, $Bi_2O_3$, $CaCO_3$, $BaCO_3$, $Nd_2O_3$, $La_2O_3$, $TiO_2$, $ZrO_2$ and $MnCO_3$ are prepared as starting raw materials, and weighed to obtain the composition formula ($Sr_aBi_bTi_cO_9$+xmol Me+ymol Zr+zwt % $MnCO_3$) (wherein Me is Ca, Ba, Nd or La, and a, b, c, x, y and z are shown in Tables 1 and 2). These raw materials are mixed in a wet manner using a ball mill for about 16 hours to obtain a mixture. The resultant mixture is dried and calcined at 70 to 900° C. to obtain a calcined product. The calcined product is coarsely ground, and then an appropriate amount of an oxygen binder is added to the ground material, and the resultant mixture is ground in a wet manner using a ball mill for 16 hours, followed by size control by passing through a 40-mesh sieve. Next, the resultant material is molded to a disk having a diameter of 20 mm and a thickness of 0.6 mm under a pressure of 1500 kg/cm², and the disk is burned in air at 1000 to 1300° C. to obtain a disk-shaped ceramic. A silver paste is coated on both main surfaces of the ceramic by the conventional method and then baked to form a silver electrode. Then, a DC voltage of 1 to 15 kV/mm is applied to the ceramic in an insulating oil of 200 to 250° C. for 30 to 60 minutes to perform polarization and to obtain a piezoelectric ceramic compact (sample).

The thickness longitudinal vibration fundamental wave of the resultant sample, i.e., $Q_{max}$ of the thickness longitudinal vibration fundamental wave of the disk-shaped vibrator, was measured. The results are shown in Table 1 and 2.

TABLE 1

| Sample No. | a | b | c | Me | x | y | z | Burning Temperature (° C.) | $Q_{max}$ |
|---|---|---|---|---|---|---|---|---|---|
| 1* | 0.5 | 4.5 | 4.0 | — | 0 | 0 |  | 1100 | 13.2 |
| 2* | 0.55 | 4.2 | 4.0 | — | 0 | 0 |  | 1150 | 14.6 |
| 3 | 0.55 | 4.3 | 4.0 | — | 0 | 0 | 0 | 1100 | 20.4 |
| 4 | 0.55 | 4.6 | 4.0 | — | 0 | 0 | 0 | 1050 | 20.7 |
| 5* | 0.55 | 4.7 | 4.0 | — | 0 | 0 | 0 | 1050 | 14.4 |
| 6* | 0.6 | 4.2 | 4.0 | — | 0 | 0 | 0 | 1200 | 13.5 |
| 7 | 0.6 | 4.3 | 4.0 | — | 0 | 0 | 0 | 1150 | 21.4 |
| 8 | 0.6 | 4.6 | 4.0 | — | 0 | 0 | 0 | 1050 | 21.9 |
| 9* | 0.6 | 4.7 | 4.0 | — | 0 | 0 | 0 | 1050 | 14.0 |
| 10* | 0.8 | 4.1 | 4.0 | — | 0 | 0 | 0 | 1100 | 14.4 |
| 11 | 0.8 | 4.2 | 4.0 | — | 0 | 0 | 0 | 1100 | 22.0 |
| 12 | 0.8 | 4.4 | 4.0 | — | 0 | 0 | 0 | 1050 | 22.7 |
| 13* | 0.8 | 4.5 | 4.0 | — | 0 | 0 | 0 | 1050 | 14.2 |
| 14* | 1.0 | 4.0 | 4.0 | — | 0 | 0 | 0 | 1200 | 13.5 |
| 15* | 0.8 | 4.1 | 4.0 | Nd | 0.1 | 0 | 0 | 1100 | 14.7 |
| 16 | 0.8 | 4.2 | 4.0 | Nd | 0.1 | 0 | 0 | 1100 | 24.1 |
| 17 | 0.8 | 4.4 | 4.0 | Nd | 0.1 | 0 | 0 | 1050 | 25.1 |
| 18* | 0.8 | 4.5 | 4.0 | Nd | 0.1 | 0 | 0 | 1050 | 14.5 |
| 19* | 0.8 | 4.1 | 4.0 | Nd | 0.2 | 0 | 0 | 1100 | 14.0 |
| 20 | 0.8 | 4.2 | 4.0 | Nd | 0.2 | 0 | 0 | 1100 | 23.3 |
| 21 | 0.8 | 4.4 | 4.0 | Nd | 0.2 | 0 | 0 | 1050 | 23.4 |
| 22* | 0.8 | 4.5 | 4.0 | Nd | 0.2 | 0 | 0 | 1050 | 14.1 |
| 23* | 0.8 | 4.4 | 4.0 | Nd | 0.25 | 0 | 0 | 1150 | 10.8 |
| 24* | 0.8 | 4.1 | 4.0 | Ba | 0.1 | 0 | 0 | 1050 | 13.9 |
| 25 | 0.8 | 4.2 | 4.0 | Ba | 0.1 | 0 | 0 | 1100 | 22.0 |
| 26 | 0.8 | 4.4 | 4.0 | Ba | 0.1 | 0 | 0 | 1050 | 22.6 |
| 27* | 0.8 | 4.5 | 4.0 | Ba | 0.1 | 0 | 0 | 1150 | 14.0 |
| 28* | 0.8 | 4.1 | 4.0 | Ba | 0.2 | 0 | 0 | 1100 | 13.9 |
| 29 | 0.8 | 4.2 | 4.0 | Ba | 0.2 | 0 | 0 | 1050 | 20.4 |
| 30 | 0.8 | 4.4 | 4.0 | Ba | 0.2 | 0 | 0 | 1050 | 20.1 |

TABLE 2

| Sample No. | a | b | c | Me | x | y | z | Burning Temperature (° C.) | $Q_{max}$ |
|---|---|---|---|---|---|---|---|---|---|
| 31* | 0.8 | 4.5 | 4.0 | Ba | 0.2 | 0 |  | 1050 | 14.6 |
| 32* | 0.8 | 4.4 | 4.0 | Ba | 0.25 | 0 |  | 1150 | 11.1 |
| 33 | 0.8 | 4.4 | 4.0 | Ca | 0.1 | 0 | 0 | 1050 | 20.4 |
| 34 | 0.8 | 4.4 | 4.0 | Ca | 0.2 | 0 | 0 | 1050 | 20.0 |
| 35* | 0.8 | 4.4 | 4.0 | Ca | 0.25 | 0 | 0 | 1050 | 13.3 |
| 36 | 0.8 | 4.4 | 4.0 | La | 0.1 | 0 | 0 | 1050 | 24.7 |
| 37* | 0.8 | 4.1 | 4.0 | — | 0 | 0.1 | 0 | 1100 | 14.0 |
| 38 | 0.8 | 4.2 | 4.0 | — | 0 | 0.1 | 0 | 1100 | 23.9 |
| 39 | 0.8 | 4.4 | 4.0 | — | 0 | 0.1 | 0 | 1050 | 21.7 |
| 40* | 0.8 | 4.5 | 4.0 | — | 0 | 0.1 | 0 | 1050 | 14.8 |
| 41* | 0.8 | 4.1 | 4.0 | — | 0 | 0.2 | 0 | 1050 | 14.0 |
| 42 | 0.8 | 4.2 | 4.0 | — | 0 | 0.2 | 0 | 1100 | 22.1 |
| 43 | 0.8 | 4.4 | 4.0 | — | 0 | 0.2 | 0 | 1050 | 18.4 |
| 44* | 0.8 | 4.5 | 4.0 | — | 0 | 0.2 | 0 | 1150 | 13.3 |
| 45* | 0.8 | 4.4 | 4.0 | — | 0 | 0.25 | 0 | 1050 | 9.8 |
| 46* | 0.8 | 4.1 | 4.0 | — | 0 | 0 | 1 | 1150 | 14.7 |
| 47 | 0.8 | 4.2 | 4.0 | — | 0 | 0 | 1 | 1100 | 22.9 |
| 48 | 0.8 | 4.4 | 4.0 | — | 0 | 0 | 1 | 1050 | 23.8 |
| 49* | 0.8 | 4.5 | 4.0 | — | 0 | 0 | 1 | 1050 | 14.5 |
| 50* | 0.8 | 4.1 | 4.0 | — | 0 | 0 | 1.5 | 1150 | 13.9 |
| 51 | 0.8 | 4.2 | 4.0 | — | 0 | 0 | 1.5 | 1050 | 22.1 |
| 52 | 0.8 | 4.4 | 4.0 | — | 0 | 0 | 1.5 | 1050 | 22.0 |
| 53* | 0.8 | 4.5 | 4.0 | — | 0 | 0 | 1.5 | 1150 | 14.6 |
| 54* | 0.8 | 4.1 | 4.0 | — | 0 | 0 | 1.6 | 1100 | 13.5 |

In the sample No. column, mark * indicates that the sample is beyond the range of the present invention.

In Tables 1 and 2, $Q_{max}$ is the largest value obtained from the samples having the same composition under various conditions (calcination temperature, burning temperature, and temperature and DC voltage of the insulating oil for polarization) of one sample taken. Although $Q_{max}$ depends upon the shape of the sample, the vibration mode and the type of the electrode used, a $Q_{max}$ of 15 or more is thought to be a practical level under the conditions used in the present invention.

Tables 1 and 2 indicate that all the samples of this embodiment of the present invention exhibit $Q_{max}$ of 15 or more, and are thus piezoelectric ceramics useful as materials for piezoelectric ceramic devices, particularly a piezoelectric ceramic oscillator and the like.

In the samples of this embodiment of the present invention, the maximum $Q_{max}$ is obtained with a low burning temperature as compared with $SrBi_4Ti_4O_{15}$, and thus a decrease in the burning temperature can be confirmed as a secondary effect of the present invention. By decreasing the burning temperature, the energy such as electric power required for burning can be decreased, and the life of a sheathed pot for containing the piezoelectric ceramic during burning can be extended to thereby decrease the production cost.

The composition of the piezoelectric ceramic compact of the present invention is not limited to this embodiment, and any composition is effective as long as it lies in the scope of the gist of the present invention.

Although in this embodiment the $Q_{max}$ of the thickness longitudinal vibration of the disk-shaped vibrator is described as an example, the present invention is not limited to the thickness longitudinal vibration of the disk-shaped vibrator, and can be applied to other vibration modes used for a piezoelectric ceramic device, particularly a piezoelectric ceramic oscillator or the like, such as a harmonic wave of thickness shear vibration or thickness longitudinal vibration in the same manner as the thickness longitudinal vibration.

T. ATSUKI et al report in Jpn. J. Appl. Pys., Vol. 34, Part 1, 9B, pp 5096–5099 that a bismuth layer compound $SrBi_2Ta_2O_9$ is used as a thin film material for a ferroelectric memory, and modified to $Sr_{0.7}Bi_{2.4}Ta_2O_9$ to improve the remanent polarization value. However, the present invention is aimed at a composition system different from that report. The present invention is also aimed at obtaining a piezoelectric ceramic compact useful as a material for a piezoelectric ceramic device, and thus the field of application is different from the above report. In addition, a material for ferroelectric memory and material for a piezoelectric ceramic device are required to have different performances, and thus the present invention cannot be easily conceived from the study of ATSUKI et al.

Figure 2:
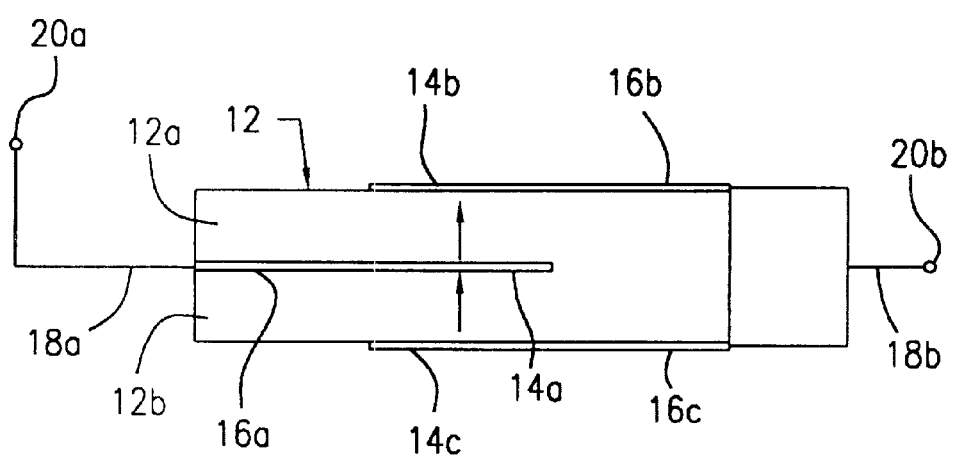
FIG. 2 is an exploded sectional view of the piezoelectric ceramic vibrator shown in FIG. 1.

FIG. 1 is a perspective view showing an example of a piezoelectric ceramic vibrator according to the present invention, and FIG. 2 is an exploded sectional view of the piezoelectric ceramic vibrator shown in FIG. 1. The piezoelectric ceramic vibrator 10 shown in FIGS. 1 and 2 comprises, for example, a rectangular piezoelectric ceramic compact 12. The piezoelectric ceramic compact 12 comprises two piezoelectric ceramic layers 12a and 12b which comprise the piezoelectric ceramic compact of the present invention, and which are laminated and integrated. The piezoelectric ceramic layers 12a and 12b are polarized in the thickness direction shown by arrows in FIG. 2.

A circular vibration electrode 14a is formed at the center between the piezoelectric ceramic layers 12a and 12b, and a T-shaped leading electrode 16a is formed from the vibration electrode 14a to one end surface of the piezoelectric ceramic compact 12. A circular vibration electrodes 14b is formed at the center of the surface of the piezoelectric ceramic layer 12a, and a T-shaped leading electrode 16b is formed from the vibration electrode 14b to the other end surface of the piezoelectric ceramic compact 12. Furthermore, a circular vibration electrode 14c is formed at the center of the surface of the piezoelectric ceramic layer 12b, and a T-shaped leading electrode 16c is formed from the vibration electrode 14c to the other end surface of the piezoelectric ceramic compact 12.

One external terminal 20a is connected to the leading electrode 16a through a lead wire 18a, and another external terminal 20b is connected to the leading electrodes 16b and 16c through a lead wire 18b.

The present invention is not limited to such a device structure as shown in the piezoelectric ceramic vibrator 10 and the vibration mode excited by the device, and the present invention can be applied to other piezoelectric ceramic devices such as a piezoelectric ceramic vibrator, a piezoelectric ceramic filter and a piezoelectric ceramic oscillator which use other device structures and vibration modes (for example, thickness shear vibration, and thickness longitudinal third harmonic wave).

The present invention can provide a piezoelectric ceramic compact useful as a material for a piezoelectric ceramic device or the like, comprising $SrBi_4Ti_4O_{15}$ as a main component, containing no or a small amount of lead or lead compound, and exhibiting $Q_{max}$ improved to a level permitting application to practical use.

What is claimed is:

1. A piezoelectric ceramic compact comprising a bismuth layer compound as a main component composed of Sr, Bi, Ti and oxygen, wherein when the molar ratio of Sr, Bi and Ti of the bismuth layer compound as the main component is a:b:c, the relations of $0.13 \leq a/c < 0.25$ and $3.5 \leq (2a+3b)/c \leq 3.75$ are satisfied.

2. A piezoelectric ceramic compact according to claim 1, wherein the main component contains a bivalent metal element other than Sr or a trivalent metal element other than Bi in an amount greater than 0 and up to about 0.05 mol per mol of Ti.

3. A piezoelectric ceramic compact according to claim 2, wherein the bivalent metal element other than Sr contained in the main component is at least one member selected from the group consisting of Mg, Ca, Ba and Pb.

4. A piezoelectric ceramic compact according to claim 2, wherein the trivalent metal element other than Bi contained in the main component is at least one member selected from the group consisting of Sc, Y, La, Ce, Pr, Nd, Sm, Gd, Dy, Er and Yb.

5. A piezoelectric ceramic compact according to claim 2, further containing an amount greater than 0 and up to about 0.025 mol of Zr relative to 1 mol of Ti in the main component.

6. A piezoelectric ceramic compact according to claim 2, further containing an amount greater than 0 and up to about 1.5% by weight of Mn in terms of $MnCO_3$.

7. A piezoelectric ceramic compact according to claim 2, containing 0.025–0.05 mol per mol of Ti of a member selected from the group consisting of Nd, Ba, Ca and La.

8. A piezoelectric ceramic compact comprising a bismuth layer compound as a main component composed of Sr, Bi, Ti and oxygen, wherein when the molar ratio of Sr, Bi and Ti of the bismuth layer compound as the main component is a:b:c, the relations of $0.13 \leq a/c \leq 0.25$ and $3.5 \leq (2a+3b)/c \leq 3.75$ are satisfied, and further containing an amount greater than 0 and up to about 0.025 mol of Zr relative to 1 mol of Ti in the main component or further containing an amount greater than 0 and up to about 1.5% by weight of Mn in terms of $MnCO_3$.

9. A piezoelectric ceramic device comprising a piezoelectric ceramic compact according to claim 8, and an electrode on the piezoelectric ceramic compact.

10. A piezoelectric ceramic compact according to claim 8, further containing an amount greater than 0 and up to about 0.025 mol of Zr relative to 1 mol of Ti in the main component.

11. A piezoelectric ceramic compact according to claim 8, further containing an amount of Mn greater than 0 and up to about 1.5% by weight in terms of $MnCO_3$.

12. A piezoelectric ceramic device comprising a piezoelectric ceramic compact according to claim 11; and an electrode on the piezoelectric ceramic compact.

13. A piezoelectric ceramic device comprising a piezoelectric ceramic compact according to claim 10; and an electrode on the piezoelectric ceramic compact.

14. A piezoelectric ceramic device comprising a piezoelectric ceramic compact according to claim 7; and an electrode on the piezoelectric ceramic compact.

15. A piezoelectric ceramic device comprising a piezoelectric ceramic compact according to claim 6; and an electrode on the piezoelectric ceramic compact.

16. A piezoelectric ceramic device comprising a piezoelectric ceramic compact according to claim 5; and an electrode on the piezoelectric ceramic compact.

17. A piezoelectric ceramic device comprising a piezoelectric ceramic compact according to claim 4; and an electrode on the piezoelectric ceramic compact.

18. A piezoelectric ceramic device comprising a piezoelectric ceramic compact according to claim 3; and an electrode on the piezoelectric ceramic compact.

19. A piezoelectric ceramic device comprising a piezoelectric ceramic compact according to claim 2; and an electrode on the piezoelectric ceramic compact.

20. A piezoelectric ceramic device comprising a piezoelectric ceramic compact according to claim 1; and an electrode on the piezoelectric ceramic compact.

* * * * *